(12) United States Patent
Miglani et al.

(10) Patent No.: US 9,887,702 B1
(45) Date of Patent: Feb. 6, 2018

(54) HIGH-SPEED DYNAMIC ELEMENT MATCHING

(71) Applicant: TEXAS INSTRUMENTS INCORPORATED, Dallas, TX (US)

(72) Inventors: Eeshan Miglani, Chhindwara (IN); Karthikeyan Gunasekaran, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/394,901

(22) Filed: Dec. 30, 2016

(51) Int. Cl.
*H03M 1/00* (2006.01)
*H03M 3/00* (2006.01)

(52) U.S. Cl.
CPC ........... *H03M 1/001* (2013.01); *H03M 3/424* (2013.01); *H03M 3/464* (2013.01)

(58) Field of Classification Search
CPC ...... H03M 1/001; H03M 3/424; H03M 3/464; H03M 1/67; H03M 1/0646; H03M 1/785; H03M 1/12
USPC .......................................... 341/155, 110, 154
See application file for complete search history.

(56) References Cited

U.S. PATENT DOCUMENTS

| | | | | |
|---|---|---|---|---|
| 7,710,092 B2 * | 5/2010 | Chapuis | ................ | H02M 3/157 323/282 |
| 7,852,253 B2 * | 12/2010 | Bien | .................. | H03M 1/0604 341/143 |
| 9,148,161 B2 * | 9/2015 | Siragusa | ............. | H03M 1/1033 |
| 2004/0257254 A1 * | 12/2004 | Jiang | ................... | H03M 1/0682 341/145 |
| 2005/0200506 A1 * | 9/2005 | Kuttner | ............... | H03M 1/0643 341/118 |
| 2007/0290907 A1 * | 12/2007 | Doerrer | ................. | H03M 3/424 341/143 |
| 2011/0114827 A1 * | 5/2011 | Yamaoka | ............... | H03K 4/026 250/214 R |

* cited by examiner

*Primary Examiner* — Jean B Jeanglaude
(74) *Attorney, Agent, or Firm* — Charles A. Brill; Frank D. Cimino (57) ABSTRACT

This disclosure includes an analog-to-digital converter (ADC) including multiple digital-to-analog converter (DAC) elements and multiple comparators, with an output of each of the comparators provided to an input of a different one of the multiple DAC elements. The ADC also includes a first voltage connection provided to each of the multiple comparators and multiple second voltage connections, with a different second voltage connection provided to each of the multiple comparators. The ADC further includes first and second resistor ladders, with the first resistor ladder configured to be switchably coupled to a first voltage supply and the second resistor ladder configured to be switchably coupled to a second voltage supply. Each of the second voltage connections is configured to be switchably coupled to a different one of the nodes in the first resistor ladder and to a different one of the nodes in the second resistor ladder.

21 Claims, 6 Drawing Sheets

HIGH-SPEED DYNAMIC ELEMENT MATCHING

BACKGROUND

Analog-to-digital converters (ADC) convert analog signals to digital signals. Most ADCs contain feedback loops that are intended to increase the accuracy with which the analog-to-digital conversion occurs. These feedback loops typically contain digital-to-analog converters (DACs) that convert the output of the ADC back to an analog voltage that can be subtracted from the analog signal being input to the ADC, with the goal of this feedback being to make the feedback analog signal equivalent to the input analog signal.

The accuracy of the ADC depends in substantial part on the accuracy with which the DAC elements operate. Many DACs are flawed because the current sources therein produce currents inconsistently—inconsistencies that often arise as a consequence of imperfect manufacturing techniques. To correct for such inconsistent current production, various switches are used in the ADC feedback loop to vary (e.g., randomize) the manner in which current sources are used, resulting in average current values that are more consistent over time. Such switching networks are large, however, and it is thus difficult for them to maintain pace with high-frequency analog input signals.

SUMMARY

At least some embodiments include an analog-to-digital converter (ADC) comprising multiple digital-to-analog converter (DAC) elements and multiple comparators, with an output of each of the comparators provided to an input of a different one of the multiple DAC elements. The ADC also comprises a first voltage connection provided to each of the multiple comparators and multiple second voltage connections, with a different second voltage connection provided to each of the multiple comparators. The ADC still further includes first and second resistor ladders, with each resistor ladder having multiple nodes and having a resistor positioned between the multiple nodes, and with each of the nodes in the first resistor ladder configured to be switchably coupled to a first voltage supply and each of the nodes in the second resistor ladder configured to be switchably coupled to a second voltage supply. Each of the second voltage connections is configured to be switchably coupled to a different one of the nodes in the first resistor ladder and to a different one of the nodes in the second resistor ladder. Such embodiments may be supplemented using one or more of the following concepts, in any order and in any combination: wherein each of the nodes in the first resistor ladder is configured to switchably couple to the first voltage supply according to a predetermined pattern, and wherein each of the nodes in the second resistor ladder is configured to switchably couple to the second voltage supply according to the predetermined pattern or according to another predetermined pattern; wherein the switchable couplings between the nodes in the first resistor ladder and the first voltage supply and between the nodes in the second resistor ladder and the second voltage supply are randomly established; further comprising a first current source in the first resistor ladder and a second current source in the second resistor ladder; wherein the ADC is selected from the group consisting of a sigma-delta ADC and a pipeline ADC; wherein the first voltage connection comprises an integrated analog signal; further comprising an output resistor coupled to a single node through which currents generated by the DAC elements flow; wherein each of the first and second resistor ladders comprises multiple voltage dividers; wherein the first and second resistor ladders comprise variable current sources; further comprising a first resistor coupled between the first voltage supply and the first resistor ladder, and further comprising a second resistor coupled between the second voltage supply and the second resistor ladder.

In at least some embodiments, a method comprises coupling first and second resistor ladders to a plurality of comparators in an analog-to-digital converter (ADC) using switches and receiving a digital code. The method also comprises, upon receipt of the digital code, altering a first switch connection between a first voltage supply and the first resistor ladder and altering a second switch connection between a second voltage supply and the second resistor ladder. The method further comprises providing an output signal based on the digital code, the first switch connection, the second switch connection, the coupling between the first resistor ladder and the plurality of comparators, and the coupling between the second resistor ladder and the plurality of comparators. Such embodiments may be supplemented using one or more of the following concepts, in any order and in any combination: further comprising altering a third switch connection between the first resistor ladder and one of the plurality of comparators as a result of receiving the digital code; further comprising altering a fourth switch connection between the second resistor ladder and another one of the plurality of comparators as a result of receiving the digital code; wherein altering the first, second, third, and fourth switch connections comprises altering the first, second, third, and fourth switch connections according to a first arrangement when the digital code is received and according to a second arrangement when the same digital code is received again; further comprising activating a first current source based on the output signal and activating a second current source as a result of receiving the digital code again; wherein the ADC is selected from the group consisting of a sigma-delta ADC and a pipeline ADC; wherein the alterations of the first and second connections are random; wherein the alterations of the first and second connections are according to a predetermined pattern.

At least some embodiments include an analog-to-digital converter (ADC), comprising a first resistor ladder comprising a first plurality of resistors, a first voltage supply configured to be switchably coupled to the first resistor ladder, a first current source configured to be switchably coupled to the first resistor ladder, a second resistor ladder comprising a second plurality of resistors, a second voltage supply configured to be switchably coupled to the second resistor ladder, a second current source configured to be switchably coupled to the second resistor ladder, and a digital controller adapted to periodically configure switches coupling the first current source to the first resistor ladder and the second current source to the second resistor ladder so that directions of current flows in the first and second resistor ladders are reversed. Such embodiments may be supplemented using one or more of the following concepts, in any order and in any combination: further comprising a plurality of comparators, each of the comparators configured to switchably couple to the first and second resistor ladders; wherein the digital controller adjusts at least some of the switches every two clock cycles.

BRIEF DESCRIPTION OF THE DRAWINGS

For a detailed description of various examples, reference will now be made to the accompanying drawings in which.

DETAILED DESCRIPTION

At least some embodiments are directed to a dynamic element matching (DEM) network, a quantizer, and accompanying digital-to-analog converter (DAC) elements that provide the ability to rapidly vary the DAC elements used to generate currents at random or according to a predetermined pattern. Because the DAC elements used for different analog-to-digital converter (ADC) output codes are varied rapidly, high-frequency input signals may be accommodated. The DEM networks disclosed herein are able to switch DAC elements more rapidly than traditional DEM networks because they contain significantly fewer switches than traditional DEM networks.

Specifically, at least some of the embodiments described herein contain a quantizer comprising multiple comparators, with the output of each comparator provided to a different DAC element. In at least some embodiments, each comparator has two inputs. The non-inverting input to each of these comparators may be provided with the analog output of a loop filter/integrator. The inverting input to each of the comparators in the quantizer may be coupled to one of multiple (in this example, two) resistor ladders in a DEM network and is thus able to obtain a reference voltage from each of the resistor ladders. Each resistor ladder may contain one or more voltage dividers and one or more current sources. Coupling the inverting input of a comparator to different nodes of a resistor ladder provides different reference voltages to the comparator. The specific voltages available at the various nodes of a resistor ladder may be determined based at least in part on the voltage supplied by a supply voltage that couples to that resistor ladder as well as the resistor ladder node to which the voltage supply couples.

Many of these connections—for example, between voltage supplies and resistor ladders, and between resistor ladders and comparator inputs—may be switchable, meaning that they may be made using switches (e.g., transistors) and that the connections may be changed as desired. This DEM architecture facilitates the rapid switching between DAC elements (e.g., based on a digital feedback signal from the output of the quantizer) and, thus, consistent current production over time, even for high-frequency input signals. This and other architectures are described in greater detail below with reference to the drawings.

Figure 1:
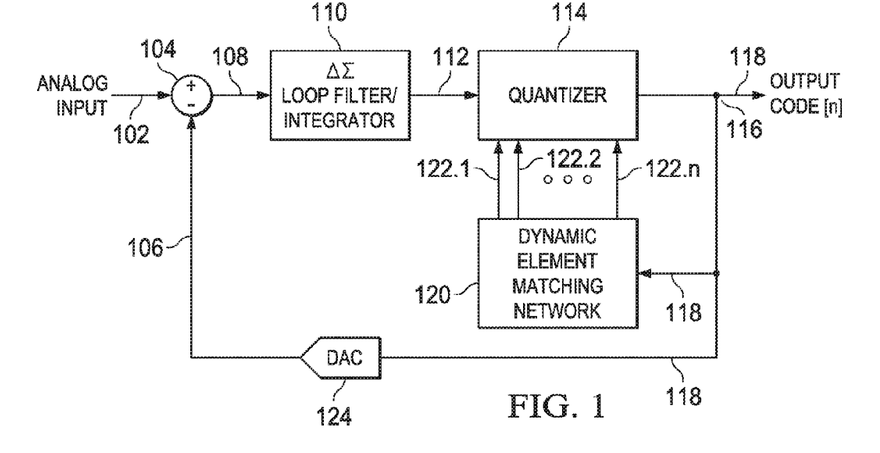
FIG. 1 depicts a block diagram of an illustrative analog-to-digital converter (ADC) in accordance with various embodiments.

FIG. 1 depicts a block diagram of an illustrative analog-to-digital converter (ADC) in accordance with various embodiments. In particular, FIG. 1 depicts an illustrative ADC 100 comprising an analog input signal 102; a differentiator 104; an analog feedback signal 106; a differentiator output signal 108; a sigma-delta loop filter/integrator ("integrator") 110; an integrator output signal 112; a quantizer 114; an output node 116 at which a digital output signal 118 (i.e., digital code) are produced; a digital feedback signal that is identical to the digital output signal 118 and is thus referred to herein as a digital feedback signal 118; a dynamic element matching (DEM) network 120; DEM network output reference signals 122.1, 122.2, . . . , 122.n; and a digital-to-analog converter (DAC) 124 comprising multiple DAC elements (e.g., current sources) that are not expressly depicted in FIG. 1 but are depicted in FIGS. 2 and 5-8. Although FIG. 1 depicts a sigma-delta ADC, the scope of disclosure is not limited to sigma-delta ADCs. The techniques and architectures disclosed herein may be readily adapted by one skilled in the art for application to other types of ADCs (e.g., pipeline ADCs) as well.

In operation, the analog feedback signal 106 is subtracted from the analog input signal 102 by the differentiator 104. The differentiator output signal 108 is provided to the integrator 110 for integration, and the resulting integrator output signal 112 is provided to the quantizer 114. As described in detail below, the quantizer 114 receives the analog output signal 112 and provides it to a plurality of comparators contained within the quantizer 114. Each of the comparators within the quantizer 114 is provided with a different reference signal—reference signals that may be rapidly altered, as described below (e.g., at a frequency commensurate with that of high frequency input signals 102). One of the comparators in the quantizer 114 may output a "1" while the remaining comparators in the quantizer 114 may output a "0." The series of bits output by the comparators in the quantizer 114 together form a digital code that is output to node 116 as digital output signal 118 (i.e., the digital feedback signal 118).

The digital feedback signal 118 is provided to the DEM network 120. The DEM network 120 may contain multiple resistor trees, voltage sources, switching mechanisms, and a digital controller. The digital controller may receive the digital feedback signal 118 and may use the digital code to determine and implement a particular configuration of switches in the DEM network 120. By configuring the switches in the DEM network 120 based on the received digital code, the DEM network 120 is able to rapidly and dynamically alter the reference signals 122.1, 122.2, . . . , 122.n. The comparators in the quantizer 114 use these updated reference signals to update the digital output signal 118, and the process repeats itself. This process increases the likelihood that each time the same digital code is received, different DAC elements are used to generate the necessary currents, and so the negative effects of the manufacturing defects described above are attenuated over time. The scope of disclosure is not limited to implementing a particular switching configuration (and thus a particular set of reference signals 122.1, 122.2, . . . , 122.n) in the DEM network 120 based on the digital signal 118. In some embodiments, for example, the digital controller in the DEM network 120 may adjust the switching configuration in the DEM network 120 randomly or according to some other, predetermined pattern. The DAC 124 contains multiple current sources and repeatedly alters the current source used to generate signal 106 based on the digital code received on digital output signal 118.

Figure 2:
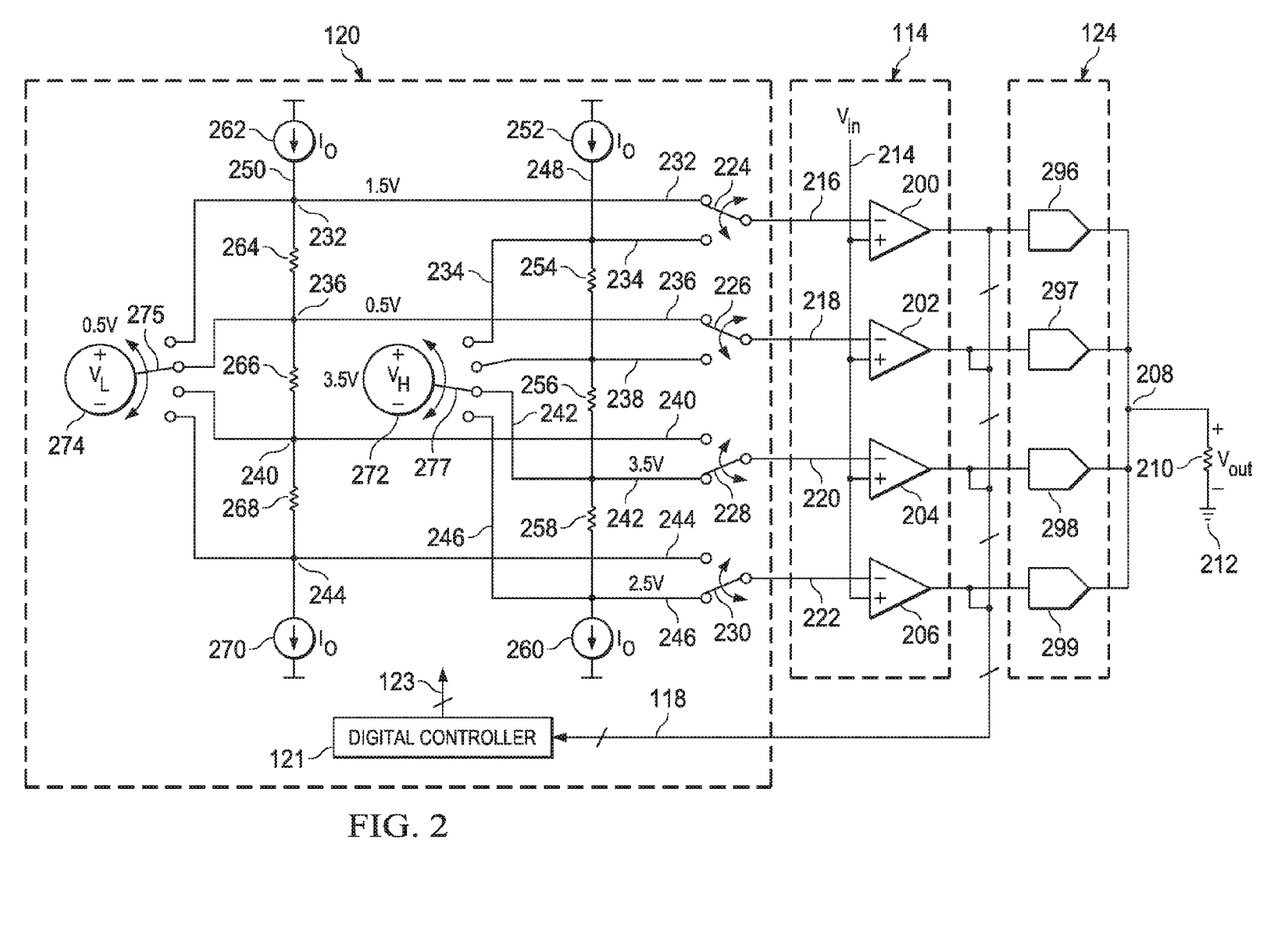
FIG. 2 depicts a circuit schematic of an illustrative dynamic element matching (DEM) network, a quantizer, and a plurality of digital-to-analog converter (DAC) elements, in accordance with various embodiments.

FIG. 2 depicts a circuit schematic of an illustrative dynamic element matching (DEM) network 120, an illustrative quantizer 114, and an illustrative DAC 124, in accordance with various embodiments. The DAC 124 may include elements (e.g., current sources) 296-299. In other embodiments, different numbers of DAC elements may be used. These elements may provide output currents, as desired. The outputs of these elements converge at node 208 and are summed according to Kirchhoff's current law. An output resistor 210 may couple to the node 208, and the output resistor 210 may couple to ground 212. An output voltage may form across the output resistor 210. Depending on the particular design implementation desired, the output resistor 210 may be omitted, and the current at node 208 may be provided to the differentiator 104. The scope of disclosure is not limited to the precise architecture, number of comparators, number of DAC elements, etc. depicted in FIG. 2.

The quantizer 114 may include illustrative comparators 200, 202, 204, and 206. In some embodiments, different numbers of comparators may be used. In some embodiments, different types of comparators (e.g., differential comparators) may be used. Each of the comparators depicted in the quantizer 114 includes an inverting input and a non-inverting input. The non-inverting inputs may couple to a common node 214, which carries the signal 112 (FIG. 1), labeled as "Vin" in FIG. 2. The inverting input of the comparator 200 may couple to node 216, which has a switch 224 on its end. The inverting input of the comparator 202 may couple to node 218, which has a switch 226 on its end. The inverting input of the comparator 204 may couple to node 220, which has a switch 228 on its end. The inverting input of the comparator 206 may couple to node 222, which has a switch 230 on its end. Each of the switches 224, 226, 228, and 230 may comprise, for instance, a transistor (e.g., a bipolar junction transistor (BJT) or a metal oxide semiconductor field effect transistor (MOSFET)). Each of these switches, as with all switches depicted and described herein, may be controlled by a digital controller 121 via connections 123. (For clarity and ease of reference, the connections 123 output by the digital controller 121 are not expressly shown as connecting to the various switches in FIG. 2. The same is true for FIGS. 6-8.)

The switch 224 may couple to either node 232 or node 234, depending on a digital control signal that the switch 224 receives from the digital controller 121. Similarly, the switch 226 may couple to either node 236 or 238, the switch 228 may couple to either node 240 or 242, and the switch 230 may couple to either node 244 or 246, all depending on the control signals received from the digital controller 121.

The nodes 232, 236, 240, and 244 may couple to different nodes of a resistor ladder 250. Similarly, the nodes 234, 238, 242, and 246 may couple to different nodes of a resistor ladder 248, as shown. The resistor ladder 250 may include one or more voltage dividers formed by multiple nodes 232, 236, 240, and 244 and the resistors 264, 266, and 268 positioned between those nodes. A supply voltage may be applied to any of the nodes 232, 236, 240, and 244, and the voltage dividers formed by the resistors 264, 266, and 268 provide different voltages at the nodes 232, 236, 240, and 244, depending at least on (1) the level of supply voltage, (2) the node at which the supply voltage is provided, and (3) the resistor values. Thus, for instance, if a 3.5 V supply voltage is provided to the node 232 on the resistor ladder 250, the resistors 264, 266, and 268 may be selected so that the node 236 produces a voltage of 2.5 V, the node 240 produces a voltage of 1.5 V, and the node 244 produces a voltage of 0.5 V. The resistor ladder 248 operates similarly.

Accordingly, as shown, the DEM network 120 may include a voltage supply 274 that is configured to switchably couple to any of the nodes 232, 236, 240, and 244. In the example of FIG. 2, the switch 275 couples the voltage supply 274 to the node 236, and thus the voltage supply of 0.5 V is applied to the node 236. This results in an illustrative voltage of 1.5 V being generated at the node 232. If the switch 275 were adjusted by the digital controller 121 to couple to, for instance, node 244, then node 244 would provide a voltage of 0.5 V, node 240 would provide a voltage of 1.5 V, node 236 would provide a voltage of 2.5 V, and node 232 would provide a voltage of 3.5 V. Thus, the switch 275 may be dynamically adjusted to rapidly provide various voltages at the various nodes of the resistor ladder 250. In at least some embodiments, the digital controller 121 contains software or firmware or is otherwise programmed to implement a particular configuration of one or more of the switches 275, 277, 224, 226, 228, and 230 based on, e.g., the digital signal 118. In some embodiments, the digital controller 121 implements switching configurations at random or according to some other, predetermined pattern. In some embodiments, the digital controller 121 comprises or at least has access to one or more clock signals. Further, in some embodiments, the digital controller 121 may be external to the DAC network 120, as may one or more of the components depicted in FIG. 2 (and in FIGS. 6-8) as being inside the DAC network 120. In addition, the resistor ladder 250 may comprise current sources 262 and 270, as depicted, and the resistor ladder 250 may further couple to positive and negative supply rails, as shown. The scope of disclosure is not limited to resistor ladders with any particular number of nodes or resistors, nor is it limited to resistors, voltage supplies, or current supplies with any particular values.

The nodes 234, 238, 242, and 246 may couple to different nodes of the resistor ladder 248. The resistor ladder 248 may include one or more voltage dividers formed by multiple nodes 234, 238, 242, and 246 and the resistors 254, 256, and 258 positioned between those nodes. A supply voltage may be applied to any of the nodes 234, 238, 242. As a result, the voltage dividers formed by the resistors 254, 256, and 258 may provide different voltages at the nodes 234, 238, 242, and 246, depending at least on (1) the level of supply voltage, (2) the node at which the supply voltage is provided, and (3) the resistor values. Thus, for instance, the voltage supply 272 may apply 3.5 V to node 242, as the position of the dynamically adjustable switch 277 shows. As a result, the voltage at the node 246, for instance, may be 2.5 V due to the voltage divider effect of resistor 258. If the switch 277 were adjusted to couple to node 234, for instance, the voltage at node 234 could be 3.5 V, the voltage at node 238 could be 2.5 V, the voltage at node 242 could be 1.5 V, and the voltage at node 246 could be 0.5 V. Thus, the switch 277 may be rapidly adjusted by the digital controller 121 to provide various voltages at the various nodes of the resistor ladder 248. The resistor ladder 248 also may comprise current sources 252, 260, as depicted, and it may further couple to positive and negative supply rails, as shown. The scope of disclosure is not limited to resistor ladders with any particular number of nodes or resistors, nor is it limited to resistors, voltage supplies, or current supplies with any particular values.

The various switches described above-namely, switches 275, 277, 224, 226, 228, and 230—may be dynamically adjusted as desired to obtain various possible reference signals at the inputs of the comparators 200, 202, 204, and 206. For example, the switch 224 may remain unchanged (coupling to node 232) but the switch 275 may be adjusted, potentially resulting in a different voltage reference signal being applied to the comparator 200. Alternatively, the switch 224 may be changed to couple to node 234, thus potentially resulting in a different voltage reference signal being applied to the comparator 200. The various switches depicted in FIG. 2 may thus be switched as desired to obtain various reference voltage values at the comparators 200, 202, 204, and 206. In at least some embodiments, the reference voltage values at the comparators are evenly-spaced and are conventionally selected, although the embodiments are not limited as such. In one example, the voltage reference values provided to the various comparators in FIG. 2 may be 0.5 V, 1.5 V, 2.5 V, and 3.5 V. In some embodiments, the voltage values of the voltage supplies 274, 272 are selected based on the lowest reference voltage value desired (e.g., 0.5 V) and the highest reference voltage value desired (e.g., 3.5 V).

As explained above, it may be desirable to vary the DAC elements that are used to produce currents with each received digital output code (or at random times, or with each clock signal) so that, when a particular digital output code on signal 118 is received multiple times, different DAC elements will likely be used to generate the appropriate currents for that output code. Because different DAC elements are used to generate the currents needed for the same output code, the average current produced for that output code will become more consistent over time. This mitigates the negative effects of DAC element manufacturing defects described above. To this end, the switches in the system depicted in FIG. 2 may be switched in a variety of ways. In some embodiments, the digital controller 121 controls the switches so that the desired set of reference voltages (e.g., 0.5 V, 1.5 V, 2.5 V, 3.5 V) are produced randomly at the various comparator inputs. In other embodiments, the switches may be switched so that the desired set of reference voltages are produced at the various comparator inputs according to a predetermined pattern. Other variations are contemplated and included within the scope of this disclosure.

Figure 3:
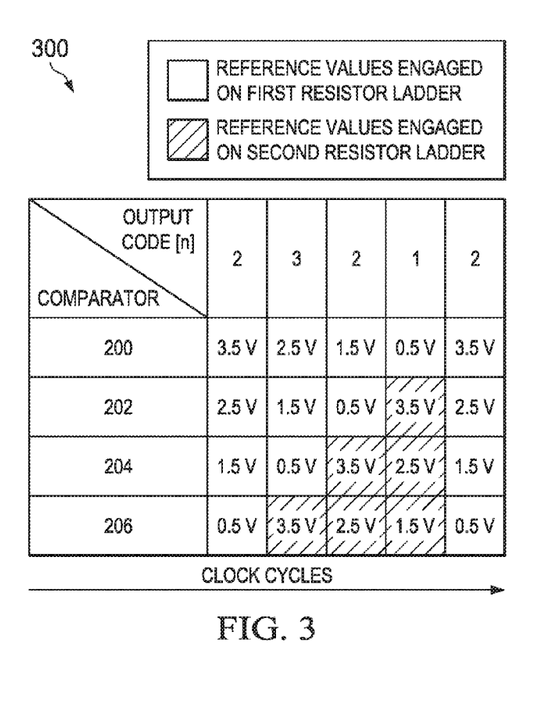
FIG. 3 is a table depicting an illustrative reference voltage provision scheme, in accordance with various embodiments.

FIG. 3 is a table 300 depicting one such illustrative, predetermined pattern. Table 300 contains six columns, the five right-most columns specifying the reference voltages provided to the various comparators 200, 202, 204, 206 (FIG. 2) for a particular digital output code [n]. For example, the second column specifies that when an illustrative output code "2" (the "2" being a label for a particular digital code and not an indication of the value of the digital code itself) is received, the reference voltages provided to comparators 200, 202, 204 and 206 may be 3.5 V, 2.5 V, 1.5 V, and 0.5 V, respectively. Similarly, the third column specifies that when a different digital output code "3" is received, the reference voltages provided to comparators 200, 202, 204 and 206 may be 2.5 V, 1.5 V, 0.5 V, 3.5 V, respectively. Compared to the reference voltages in the second column, the reference voltages in the third column are shifted by one index number. The fourth column specifies that when the next digital output code is received, the reference voltages provided to comparators 200, 202, 204, and 206 may be 1.5 V, 0.5 V, 3.5 V, and 2.5 V, respectively—again, an index shift of one. Notably, the output code "2" has now been received twice, with different reference voltages provided to different comparators each time. This results in greater diversity in the DAC elements that are used to produce the appropriate currents to produce the analog feedback signal 106 of the DAC 124 (FIG. 1), and this increased diversity results in average current values that are more consistent and reliable over time. As mentioned, in this and other embodiments described herein, voltages provided at the various nodes may change when new digital codes are received (as described above); with each clock cycle; according to a predetermined pattern; or according to a randomized pattern. All such variations fall within the scope of this disclosure.

In addition to specifying illustrative reference values that may be provided to the various comparators of FIG. 2, table 300 also specifies the resistor ladder connections that may be engaged to provide the specified reference values to the comparators. Specifically, the shaded areas indicate reference voltages that may be provided using one resistor ladder, and the non-shaded areas indicate reference voltages that may be provided using a different resistor ladder. The fourth column of table 300 corresponds to the switch configuration depicted in FIG. 2. Referring simultaneously to FIGS. 2 and 3, the fourth column of table 300 indicates that comparator 200 may receive a 1.5 V reference voltage by being coupled to a first resistor ladder. Accordingly, FIG. 2 depicts the voltage supply 274 providing 0.5 V to node 236, and the resistor 264 causing the voltage at node 232 to be 1.5 V. The switch 224 couples node 216 to node 232, thus providing 1.5 V to the comparator 200 as a reference voltage. Similarly, the same column of table 300 specifies that the comparator 202 may receive 0.5 V, and, as FIG. 2 depicts, comparator 202 couples to node 236 via switch 226, and node 236 carries 0.5 V from voltage supply 274. Thus, comparator 202 receives a 0.5 V reference voltage. Both comparators 200 and 202 receive their reference voltages from the resistor ladder 250. The same column of table 300 also indicates that comparator 204 may receive a 3.5 V reference voltage from a different resistor ladder—e.g., resistor ladder 248. As FIG. 2 depicts, voltage supply 272 provides 3.5 V to node 242, and switch 228 couples node 220 to node 242, thus providing comparator 204 with 3.5 V. Similarly, comparator 206 couples to node 246 via switch 230 and node 222, thus providing 2.5 V as a reference voltage to comparator 206, as the fourth column of table 300 specifies. The scheme of table 300 is merely illustrative. Any suitable randomized, predetermined, or other type of pattern may be used to provide varying sets of reference voltages to the comparators.

Figure 4:
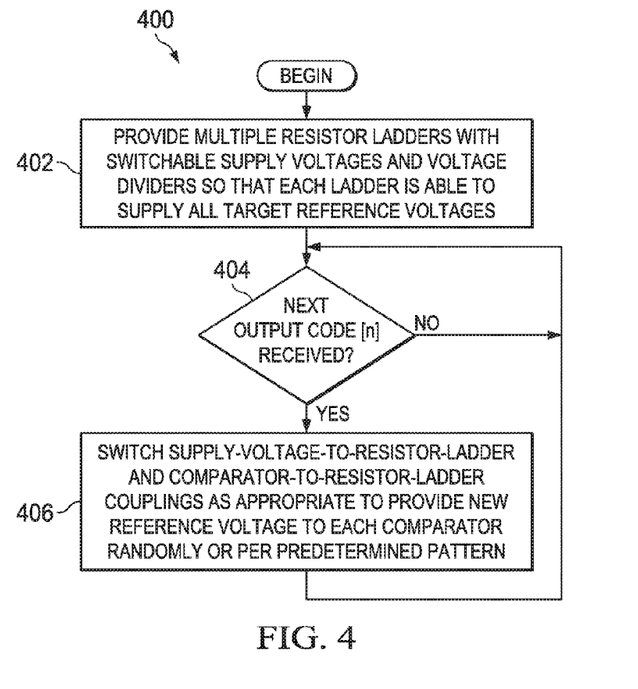
FIG. 4 is a flow diagram of an illustrative process in accordance with various embodiments.

FIG. 4 is a flow diagram of an illustrative process 400. The process 400 begins by providing multiple resistor ladders with switchable supply voltages and voltage dividers so that each ladder is able to supply some or all target reference voltages (step 402). An illustrative setup that complies with this step is depicted in FIG. 2 and is described above. The process 400 next comprises determining whether a next digital output code has been received (step 404). Referring to FIG. 1, the output code is the digital output code provided in the digital feedback signal 118, as explained. If a next digital output code is received (or another triggering event occurs, such as the arrival of a new clock cycle, or the generation of a random digital output code by the digital controller 121, etc.), the process 400 comprises switching the supply-voltage-to-resistor-ladder and comparator-to-resistor-ladder coupling as appropriate to provide new reference voltages to each comparator (step 406). This step may occur either randomly or according to a predetermined pattern, as described in detail above. Control of the process 400 then returns to step 404. The process 400 may be modified as desired, including by adding, deleting, modifying, and/or rearranging one or more steps.

Figure 5:
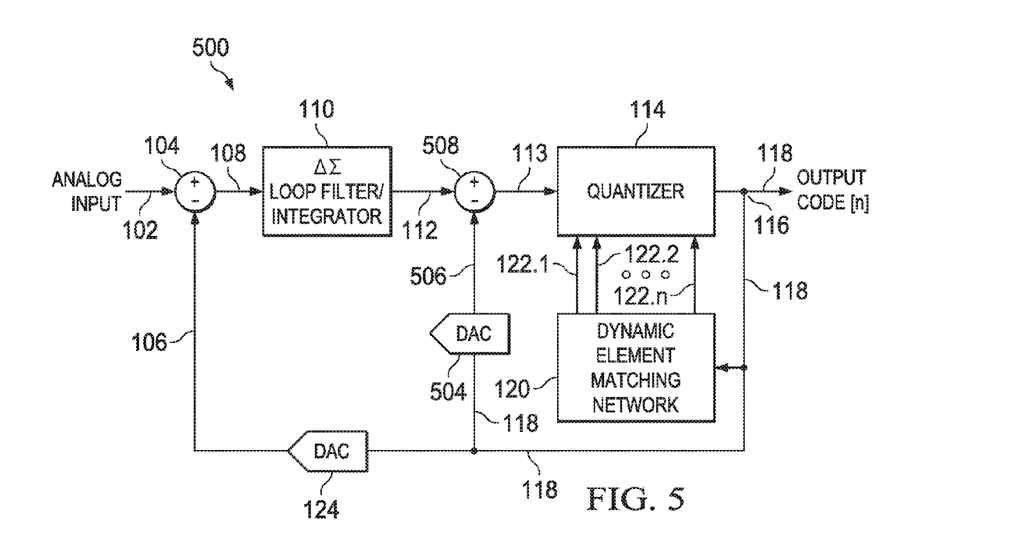
FIG. 5 depicts a block diagram of another illustrative ADC in accordance with various embodiments.

FIG. 5 depicts a block diagram of another illustrative ADC in accordance with various embodiments. The illustrative ADC of FIG. 5 comprises an additional feedback loop that may facilitate faster and more accurate operation than the illustrative ADC of FIG. 1. In particular, FIG. 5 depicts an ADC 500 that comprises many of the same components as the ADC 100 of FIG. 1—e.g., the analog input signal 102; the differentiator 104; the analog feedback signal 106; the differentiator output signal 108; the integrator 110; the integrator output signal 112; the quantizer 114; the output node 116 carrying a digital output signal 118; the digital feedback signal 118; the DEM network 120; the DEM network output signals 122.1, 122.2, . . . , 122.n; and the DAC 124. The ADC 500 additionally comprises another differentiator 508; another differentiator output signal 113; another DAC 504 (which, like the DAC 124, comprises multiple DAC elements that source current); and analog output signal 506. The DEM network 102 receives the digital feedback signal 118 and uses the signal 118 to produce reference signals that are provided to the comparators of the quantizer 114, as explained above. The DAC 504 provides its output signal 506 to the differentiator 508. Thus, the ADC 500 has two feedback loops—one containing the DAC 124, and one containing the DAC 504.

Figure 6:
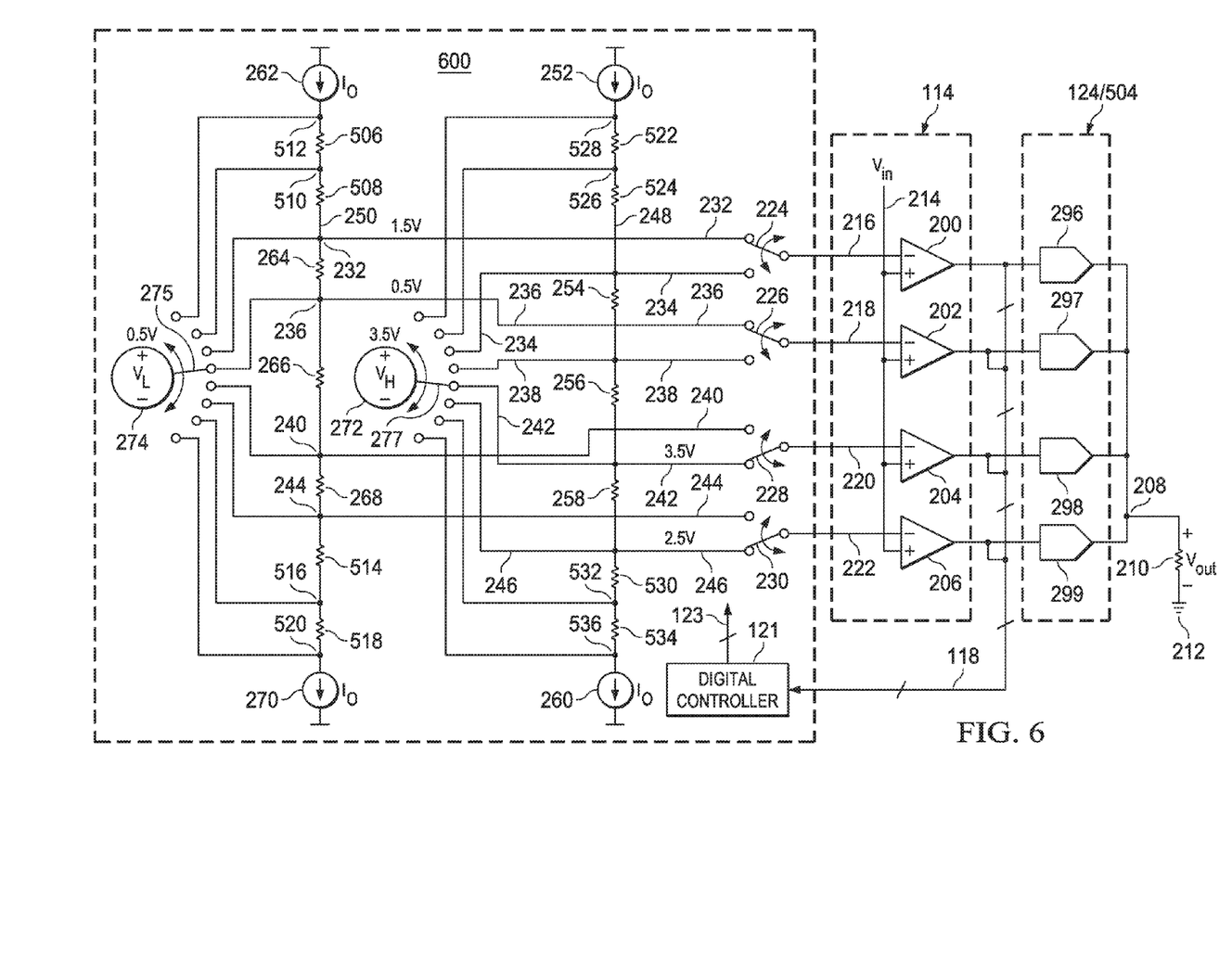
FIG. 6 depicts a circuit schematic of another illustrative DEM network, a quantizer, and a plurality of DAC elements, in accordance with various embodiments.

FIG. 6 depicts a circuit schematic of the illustrative DEM network 600, the illustrative quantizer 118, and a plurality of DAC elements in the illustrative DAC 124 (which may, in some embodiments, be identical to the DAC 504 and is thus labeled as "504/124" in FIG. 6). The architecture depicted in FIG. 6 may be implemented, for example and without limitation, in the ADCs of FIG. 1 and/or FIG. 5. (More generally, any architecture depicted in FIGS. 2 and 6-8 may be implemented, for instance and without limitation, in the ADCs of FIG. 1 and/or FIG. 5.) The architecture of the illustrative DEM network 600 is nearly identical to that of the DEM network 120 of FIG. 2, with the exception of additional resistors 506, 508 and nodes 510, 512 near the top of the resistor ladder 250, as well as additional resistors 514, 518 and nodes 516, 520 near the bottom of the resistor ladder 250. In addition, the DEM network 600 may comprise resistors 522, 524 and nodes 526, 528 near the top of the resistor ladder 248, as well as additional resistors 530, 534 and nodes 532, 536 near the bottom of the resistor ladder 248. As with the DEM network 120, the digital controller 121 may control the switches in the DEM network 600 (including switches 275, 277). The digital controller 121 controls at least some of the switches (e.g., switches 275, 277) based on the outputs of the comparators 200, 202, 204, and 206.

In operation, the Vin line 214 carries the differentiator output signal 112 (in the case of an implementation similar to that of FIG. 1) or the differentiator output signal 113 (in the case of an implementation similar to that of FIG. 5). The signal on line 214 may be provided to the non-inverting inputs of the comparators 200, 202, 204, and 206 in the quantizer 114. The inverting inputs to the comparators 200, 202, 204 and 206 may be determined based on the switching network of the DEM network 600 as described above with respect to the DEM network 120. The digital controller 121 may determine the positions of the switches 275, 277 based on the outputs of the comparators 200, 202, 204, and 206. Specifically, there are five possible outputs of the comparators—all may output 0, one may output 1, two may output 1, three may output 1, or four may output 1. Based on which of these five possible outputs the bank of comparators produces, the digital controller 121 adjusts the switches 275, 277 so that all reference voltages produced on both of the resistor ladders 250, 248 are increased by two steps (e.g., two least significant bits (LSBs)), increased by one step (e.g., one LSB), increased by zero steps (i.e., no change in reference voltages), decreased by one step (e.g., one LSB), or decreased by two steps (e.g., two LSBs). The additional resistors 506, 508, 514, 518, 522, 524, 530, and 534 facilitate these increases and decreases in reference voltages provided to the comparators. Thus, for instance, although 0.5 V is currently provided at node 236, by coupling the voltage supply 274 to node 240 via the switch 275, the node 236 may provide 1.5 V. Similarly, by coupling the voltage supply 274 to node 520, the node 236 may provide 4.5 V (with nodes 516, 244, and 240 providing 1.5 V, 2.5 V, and 3.5 V, respectively).

Although the reference voltage values on the various nodes of the two resistor ladders may be adjusted as desired based on the comparator outputs, in at least some embodiments, the reference voltage values are adjusted based on the comparator outputs to implement a compensation coefficient of 1. Furthermore, in at least some embodiments, the reference voltage values on the two resistor ladders are shifted identically—i.e., by the same amount and in the same direction (increasing voltage or decreasing voltage). The outputs of the comparators 200, 202, 204, and 206 may be provided to the DAC elements 296-299 (e.g., to DAC elements 296-299 in the DAC 124 in the case of an ADC such as that in FIG. 1, or to DAC elements 296-299 in each of the DACs 124 and 504 in an ADC such as that in FIG. 5), and the outputs of the DAC elements 296-299 may be output, e.g., as depicted in FIG. 1 or FIG. 5. Any and all variations and permutations of the precise architecture described herein are contemplated and included within the scope of this disclosure.

Figure 7:
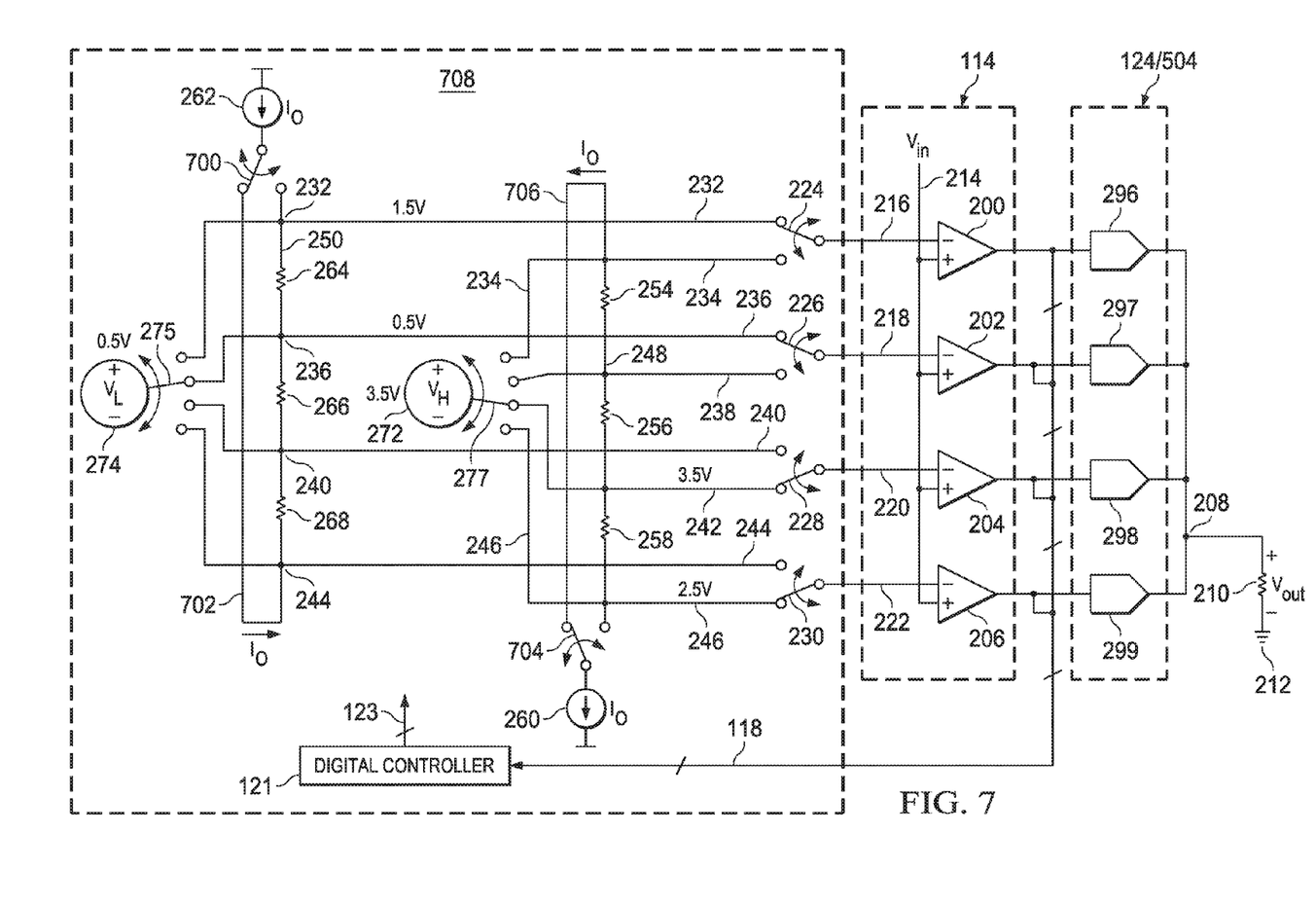
FIG. 7 depicts a circuit schematic of yet another illustrative DEM network, a quantizer, and a plurality of DAC elements, in accordance with various embodiments.

FIG. 7 depicts a circuit schematic of yet another illustrative DEM network 708, the quantizer 114, and a plurality of DAC elements in the DAC 504/124, in accordance with various embodiments. The DEM network 708 may be implemented in an ADC in lieu of the DEM network 120 of FIG. 1. The DEM network 708 is virtually identical to the DEM network 120 of FIG. 1, with the following exceptions: the resistor ladder 250 may couple to only one current source 262; the resistor ladder 248 may couple to only one current source 260; the current source 262 may couple to the resistor ladder 250 via a switch 700 (controlled by, e.g., the digital controller 121) that dictates the direction of current flow through the resistor ladder 250; and the current source 260 may couple to the resistor ladder 248 via a switch 704 (controlled by, e.g., the digital controller 121) that dictates the direction of current flow through the resistor ladder 248. For instance, the switch 700, when coupled as shown in FIG. 7, causes current from the current source 262 to flow through node 702 and to come back up through the resistor ladder 250. Similarly, the switch 704, when positioned as shown in FIG. 7, causes current from the current source 260 to flow through the node 706 and to come back down through the resistor ladder 248.

In accordance with embodiments, the direction of current flow through the resistor ladders 250, 248 may be periodically altered as another technique to vary the manner in which the DAC elements 296-299 are used so that errors in the DAC elements are mitigated over time. The digital controller 121 may switch the switches 700, 704 (as well as other switches in the DEM network 708) to achieve any desired DAC element variation scheme. In at least some embodiments, however, the switches 700, 704 are switched every two cycles (e.g., clock cycles or data cycles, with each data cycle associated with the arrival of a new digital code from the comparators of the quantizer 114). In some such embodiments, the switches 700, 704 switch on a staggered basis, meaning that the switch 700 may switch for a first cycle, the switch 704 may switch for a second cycle, the switch 700 may switch for a third cycle, the switch 704 may switch for a fourth cycle, and so on. In other such embodiments, the switches 700, 704 switch simultaneously, meaning that switches 700, 704 both switch for a first cycle, neither switch switches for a second cycle, both switches switch for a third cycle, and so on. Additional variations and permutations of this technique are contemplated and fall within the scope of this disclosure.

In an illustrative operation, the digital controller 121 may receive a digital code signal "2" during a first clock cycle. During the same cycle, the nodes 232, 236, 240, and 244 of the resistor ladder 250 may be set at 3.5 V, 2.5 V, 1.5 V, and 0.5 V, respectively. Further assume that the comparators 200, 202, 204, and 206 couple to nodes 232, 236, 240, and 244, respectively. In that case, because the signal on connection 214 is greater than 0.5 V and 1.5 V but less than 2.5 V and 3.5V, the comparators 204 and 206 would output a "1," while comparators 200 and 202 would output a "0." Two clock cycles later, a digital code signal equivalent to a "3" is received, and the directions of the currents through the resistor ladders 250, 248 may be reversed. In that same clock cycle, the switches 275, 277 may be adjusted so that voltage supply 274 couples to node 240, and voltage supply 272 couples to node 238. Because the current flows in the two resistor ladders are reversed during this clock cycle, the node 244 provides 1.5 V and the node 234 provides 2.5 V. Comparators 200 and 202 may couple to nodes 234 and 238, respectively, while comparators 204 and 206 may couple to nodes 240 and 244, respectively. In that case, the comparators 204, 206, and 200 would each output a "1," while comparator 202 would output a "0." Two clock cycles later, the directions of current flow through the resistor ladders 250, 248 may be switched again. The scope of disclosure is not limited to any particular frequency of current flow switching, any particular staggering of current flow switching between the resistor ladders, or any particular scope of application for this technique.

Figure 8:
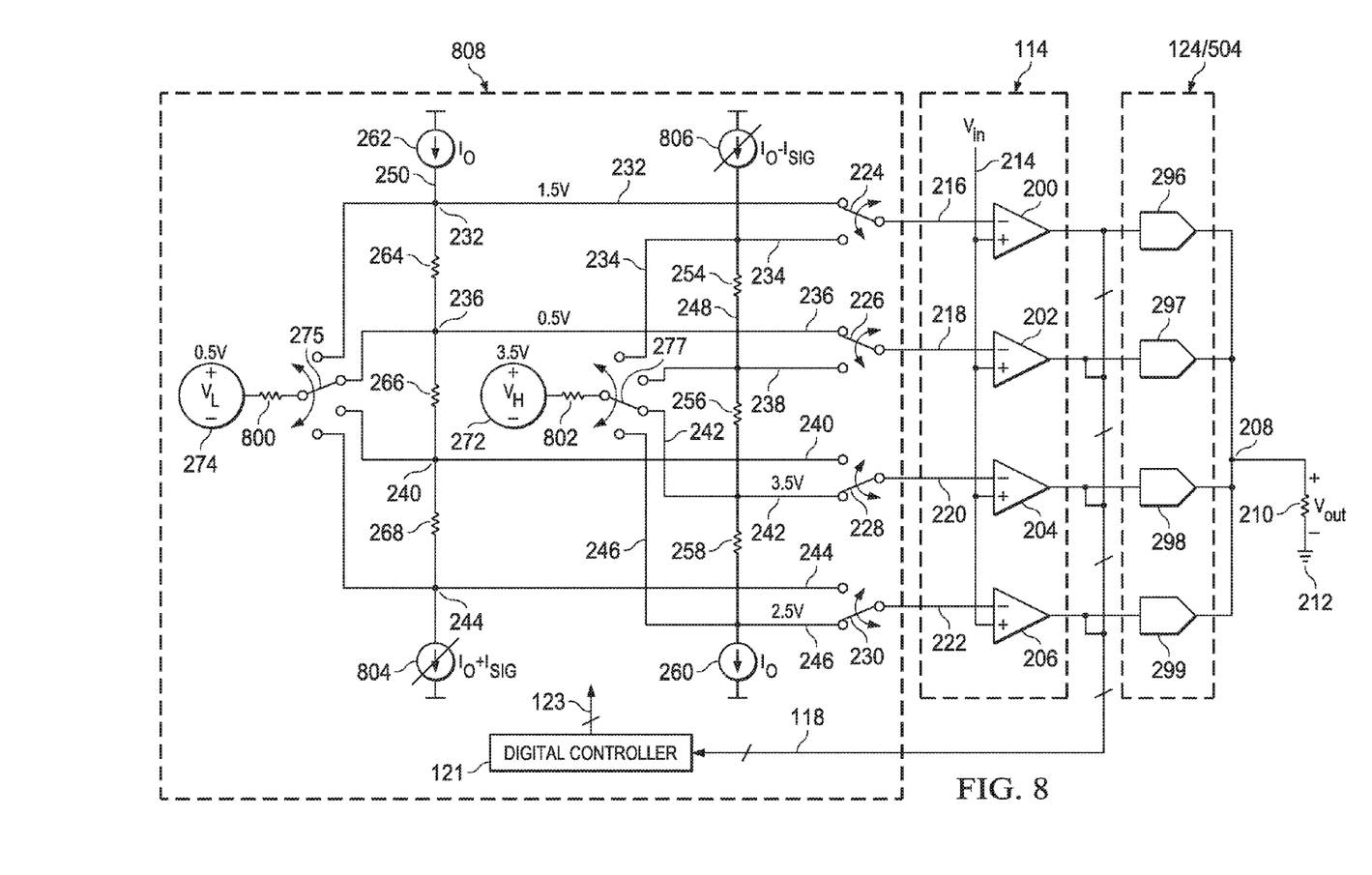
FIG. 8 depicts a circuit schematic of still another illustrative DEM network, a quantizer, and a plurality of DAC elements, in accordance with various embodiments.

FIG. 8 depicts a circuit schematic of still another illustrative DEM network 808, the quantizer 114, and a plurality of DAC elements in DAC 504/124, in accordance with various embodiments. The DEM network 808 may be implemented in any suitable ADC feedback loop—for example, in either of the loops depicted in FIG. 5. The DEM network 808 is virtually identical to the DEM network 120 of FIG. 1, except that the current sources 804, 806 are variable current sources, and resistors 800, 802 are coupled to the voltage supplies 274, 272, respectively. The DEM network 808 and the DEM network 600 of FIG. 6 share at least one function in common: to expand the range of possible reference values available on each resistor ladder 250, 248. More specifically, the variable current source 804 is capable of providing a current that may be greater than or less than current $I_O$ provided by current source 262. If a different current is provided, any excess current in the ladder 250 will flow through the resistor 800, with the direction of current flow through the resistor 800 depending on whether the current provided by variable current source 804 is larger or smaller than that provided by the current source 262. Similarly, excess current in the resistor ladder 248 flows through the resistor 802, with the direction of current flow depending on whether the current provided by variable current source 806 is larger or smaller than that provided by the current source 260. In either case, the resistors 800, 802 may introduce voltage drops, and these voltage drops apply to any node to which the voltage supplies may couple via the switches 275, 277. Thus, for instance, the current flow through the ladder 250 may be such that the voltage drop across resistor 800 causes the reference voltage at node 232 to change from 1.5 V to 0.5 V or, with the opposite direction of current flow, from 1.5 V to 2.5 V. Reference voltage values in both the resistor ladders 250, 248 may thus be rapidly manipulated by adjusting the variable current sources 804 and 806. Accordingly, the manner in which DAC elements 296-299 are engaged varies, thus providing more consistent average current values over time.

The above discussion is meant to be illustrative. Numerous variations and modifications will become apparent to those skilled in the art once the above disclosure is fully appreciated. It is intended that the following claims be interpreted to embrace all such variations and modifications.

What is claimed is:

1. An analog-to-digital converter (ADC), comprising:
multiple digital-to-analog converter (DAC) elements;
multiple comparators, an output of each of the comparators provided to an input of a different one of the multiple DAC elements;
a first voltage connection provided to each of the multiple comparators;
multiple second voltage connections, a different second voltage connection provided to each of the multiple comparators; and
first and second resistor ladders, each resistor ladder having multiple nodes and having a resistor positioned between the multiple nodes, each of the nodes in the first resistor ladder is configured to be switchably coupled to a first voltage supply and each of the nodes in the second resistor ladder is configured to be switchably coupled to a second voltage supply,
wherein each of the second voltage connections is configured to be switchably coupled to a different one of the nodes in the first resistor ladder and to a different one of the nodes in the second resistor ladder.

2. The ADC of claim 1, wherein each of the nodes in the first resistor ladder is configured to switchably couple to the first voltage supply according to a predetermined pattern, and wherein each of the nodes in the second resistor ladder is configured to switchably couple to the second voltage supply according to the predetermined pattern or according to another predetermined pattern.

3. The ADC of claim 1, wherein the switchable couplings between the nodes in the first resistor ladder and the first voltage supply and between the nodes in the second resistor ladder and the second voltage supply are randomly established.

4. The ADC of claim 1, further comprising a first current source in the first resistor ladder and a second current source in the second resistor ladder.

5. The ADC of claim 1, wherein the ADC is selected from the group consisting of a sigma-delta ADC and a pipeline ADC.

6. The ADC of claim 1, wherein the first voltage connection comprises an integrated analog signal.

7. The ADC of claim 1, further comprising an output resistor coupled to a single node through which currents generated by the DAC elements flow.

8. The ADC of claim 1, wherein each of the first and second resistor ladders comprises multiple voltage dividers.

9. The ADC of claim 1, wherein the first and second resistor ladders comprise variable current sources.

10. The ADC of claim 9, further comprising a first resistor coupled between the first voltage supply and the first resistor ladder, and further comprising a second resistor coupled between the second voltage supply and the second resistor ladder.

11. A method, comprising:
coupling first and second resistor ladders to a plurality of comparators in an analog-to-digital converter (ADC) using switches;
receiving a digital code;
upon receipt of the digital code, altering a first switch connection between a first voltage supply and the first resistor ladder and altering a second switch connection between a second voltage supply and the second resistor ladder; and
providing an output signal based on the digital code, the first switch connection, the second switch connection, the coupling between the first resistor ladder and the plurality of comparators, and the coupling between the second resistor ladder and the plurality of comparators.

12. The method of claim 11, further comprising altering a third switch connection between the first resistor ladder and one of the plurality of comparators as a result of receiving the digital code.

13. The method of claim 12, further comprising altering a fourth switch connection between the second resistor ladder and another one of the plurality of comparators as a result of receiving the digital code.

14. The method of claim 13, wherein altering the first, second, third, and fourth switch connections comprises altering the first, second, third, and fourth switch connections according to a first arrangement when the digital code is received and according to a second arrangement when the same digital code is received again.

15. The method of claim 11, further comprising activating a first current source based on the output signal and activating a second current source as a result of receiving the digital code again.

16. The method of claim 11, wherein the ADC is selected from the group consisting of a sigma-delta ADC and a pipeline ADC.

17. The method of claim 11, wherein the alterations of the first and second connections are random.

18. The method of claim 11, wherein the alterations of the first and second connections are according to a predetermined pattern.

19. An analog-to-digital converter (ADC), comprising:
a first resistor ladder comprising a first plurality of resistors;
a first voltage supply configured to be switchably coupled to the first resistor ladder;
a first current source configured to be switchably coupled to the first resistor ladder;
a second resistor ladder comprising a second plurality of resistors;
a second voltage supply configured to be switchably coupled to the second resistor ladder;
a second current source configured to be switchably coupled to the second resistor ladder; and
a digital controller adapted to periodically configure switches coupling the first current source to the first resistor ladder and the second current source to the second resistor ladder so that directions of current flows in the first and second resistor ladders are reversed.

20. The ADC of claim 19, further comprising a plurality of comparators, each of the comparators configured to switchably couple to the first and second resistor ladders.

21. The ADC of claim 19, wherein the digital controller adjusts at least some of the switches every two clock cycles.

* * * * *